United States Patent
Nilssen

(10) Patent No.: US 6,229,718 B1
(45) Date of Patent: May 8, 2001

(54) PARALLEL-RESONANT BRIDGE INVERTER

(76) Inventor: Ole K. Nilssen, Caesar Dr., Rte. 5, Barrington, IL (US) 60010

( * ) Notice: Subject to any disclaimer, the term of this patent is extended or adjusted under 35 U.S.C. 154(b) by 0 days.

(21) Appl. No.: 07/952,303

(22) Filed: Oct. 2, 1989

Related U.S. Application Data

(63) Continuation of application No. 06/658,423, filed on Oct. 5, 1984, now abandoned.

(51) Int. Cl.$^7$ .................. H02M 5/45; H02M 7/5387; H05B 41/29
(52) U.S. Cl. .................. 363/37; 363/132; 315/209 R
(58) Field of Search .................. 361/131 R; 315/209 R, 315/DIG. 7, DIG. 5, 244, 209, 243, 219, 227 R, 200 R, 207, 208, 86, 307, 297, 246, 278, 287, 224; 363/17, 98, 132, 36, 37, 136

(56) References Cited

U.S. PATENT DOCUMENTS

| | | | |
|---|---|---|---|
| 2,965,856 | * 12/1960 | Roesel | 363/132 |
| 3,155,875 | * 11/1964 | Wenrich et al. | 363/132 |
| 3,868,561 | * 2/1975 | Matthes | 363/36 |
| 4,184,128 | * 1/1980 | Nilssen | 331/113 A |
| 4,277,726 | * 7/1981 | Burke | 315/98 |
| 4,307,353 | * 12/1981 | Nilssen | 331/113 A |
| 4,346,332 | * 8/1982 | Walden | 315/307 |
| 4,469,988 | * 9/1984 | Cronin | 315/209 R |
| 4,504,895 | * 3/1985 | Steigerwald | 363/132 |

FOREIGN PATENT DOCUMENTS

| | | | |
|---|---|---|---|
| 135689 | * 8/1982 | (JP) | 363/37 |
| 153473 | * 9/1984 | (JP) | 363/132 |

OTHER PUBLICATIONS

Baker, "High Freq. Pwr.Conv. with FET—Contr. Res. Charge Transfer", PCI Apr. 1983 Proceedings, pp. 130–133.*
No Author, "Buck–Regulator and H–Inverter", Elekt. –Applikation, vol. 13, No. 1, pp. 28, 29, 1981.*

* cited by examiner

Primary Examiner—Adolf Deneke Berhane

(57) ABSTRACT

Power to a self-oscillating full-bridge inverter is supplied from a center-tapped DC voltage source through an inductor means having two separate windings on a common magnetic core—with one winding being positioned in each leg of the power supply. The full-bridge inverter, which comprises four switching transistors connected in usual full-bridge fashion, is loaded by way of a center-tapped parallel-tuned L-C circuit connected across the bridge output, thereby providing a sinusoidal voltage at its output. Due to the effect of the inductor means, the current provided to the bridge is substantially constant during a complete period of the inverter's oscillation.

The arrangement is completely symmetrical, which provides for the center-tap of the DC voltage source to be at the same potential as the center-tap of the parallel-tuned L-C circuit.

26 Claims, 1 Drawing Sheet

PARALLEL-RESONANT BRIDGE INVERTER

This application is a continuation of Ser. No. 06/658,423 filed Oct. 5, 1984, abandoned.

BACKGROUND OF THE INVENTION

1. Field of Invention

The present invention relates to self-oscillating transistor full-bridge inverters, particularly of a type that provides sinusoidal output voltage.

2. Description of Prior Art

Although self-oscillating transistor inverters providing their output in the form of sinusoidal voltage do presently exist —as for instance described in U.S. Pat. Nos. 4,370,600 and 4,392,087 to Zansky, or in U.S. Pat. No. 4,277,726 to Burke —full-bridge inverters of that type do not presently exist. Yet, full-bridge inverters have several significant advantages as compared with half-bridge or regular push-pull inverters, especially in terms of voltage, current and/or power handling capabilities.

SUMMARY OF THE INVENTION

Objects of the Invention

A first object of the present invention is that of providing a self-oscillating full-bridge transistor inverter with substantially sinusoidal output voltage.

A second object is that of providing a full-bridge inverter powered from a center-tapped DC voltage source and having its own output center-tapped.

A third object is that of providing an inverter that is particularly cost-effective, efficient and versatile in use.

These, as well as other important objects and advantages of the present invention will become apparent from the following description.

Brief Description

In its preferred embodiment, subject invention is a full-bridge inverter comprising four switching transistors and being symmetrically powered from a center-tapped DC voltage source through an inductor means having two windings on a single magnetic core—with one winding positioned in each leg of the DC source. This full-bridge inverter has a center-tapped parallel-resonant L-C circuit connected across its output, and is made to self-oscillate by way of two positive feedback current-transformers, each connected in series with the center-tapped L-C circuit and any load connected thereto.

The outputs from the current-transformers are applied to the control terminals of the four switching transistors, thereby providing load-proportional drive to these transistors.

The center-tapped DC voltage source, the inductor means and the full-bridge inverter circuit with its two feedback current-transformers are connected together in symmetrical fashion; which provides for the center-tap of the inverter output to be at the same potential as the center-tap of the DC voltage source. Thus, since the center-tap of the DC source is grounded, the center-tap of the inverter's output is grounded as well; which, in turn, implies that any load connected to the inverter's output is symmetrically referenced to ground.

The feedback current-transformers are saturable and so designed as to saturate approximately at the time the inverter's output voltage reaches zero magnitude.

A Zener-type voltage-limiting device is connected directly between the inverter's DC power input terminals, thereby to protect the transistors from voltage transients of excessive magnitude.

DESCRIPTION OF THE PREFERRED EMBODIMENT

Details of Construction

Figure 1:
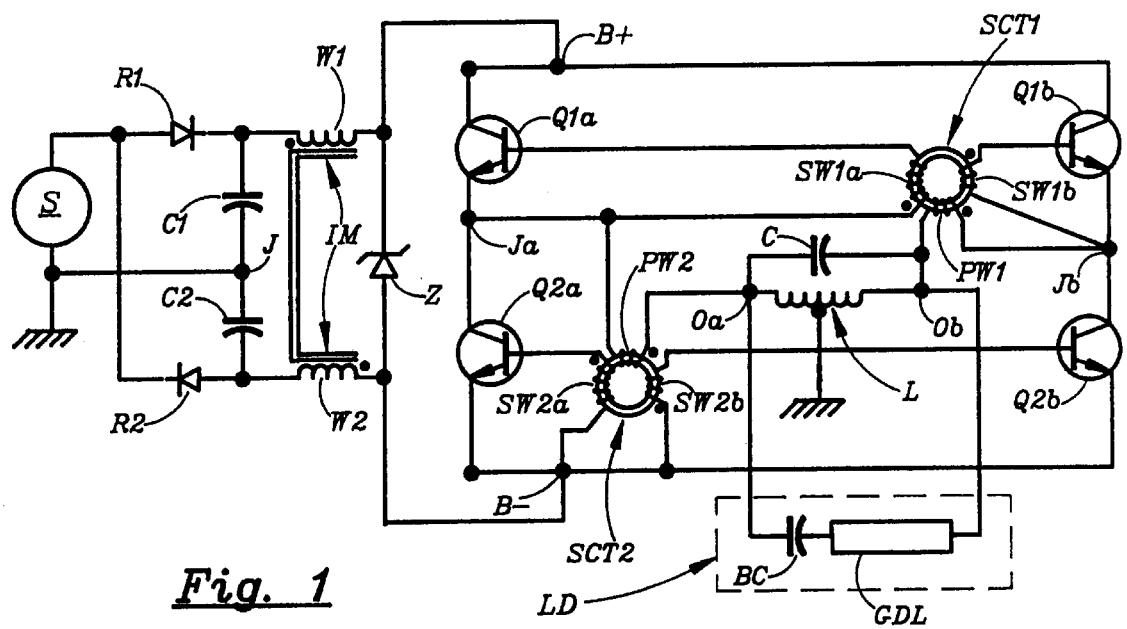
FIG. 1 schematically illustrates the preferred embodiment of the invention.

FIG. 1 shows an AC power supply S, which in reality is an ordinary 120 Volt/60 Hz electric utility power line.

One terminal of power supply S is grounded and also directly connected to a junction J between two energy-storing capacitors C1 and C2. The other terminal of power supply S is connected to the anode of a rectifier R1 and to the cathode of a rectifier R2. Rectifier R1 has its cathode connected to one terminal of C1—the other terminal of C1 being connected to junction J. Rectifier R2 has its anode connected to one terminal of C2—the other terminal of C2 being connected to junction J.

An inductor means IM has two equal but separate windings W1 and W2: W1 is connected between the cathode of rectifier R1 and a junction B+ between the collectors of two transistors Q1a and Q1b; W2 is connected between the anode of R2 and a junction B− between the emitters of two transistors Q2a and Q2b.

A Zener diode Z is connected between junction B+ and junction B−.

Transistor Q1a is connected with its emitter to a junction Ja, as is also the collector of transistor Q2a. Transistor Q1b is connected with its emitter to a junction Jb, as is also the collector of transistor Q2b.

A center-tapped inductor L is connected between inverter output terminals Oa and Ob. Connected in parallel with L is a capacitor C. The center-tap on inductor L is grounded.

Primary winding PW1 of saturable current-transformer SCT1 is connected between junction Jb and output terminal Ob. Primary winding PW2 of saturable current-transformer SCT2 is connected between junction Ja and output terminal Oa.

One secondary winding SW1a of transformer SCT1 is connected between the base and the emitter of transistor Q1a; another secondary winding SW1b of transformer SCT1 is connected between the base and the emitter of transistor Q1b.

One secondary winding SW2a of transformer SCT2 is connected between the base and the emitter of transistor Q2a; another secondary winding SW2b of transformer SCT2 is connected between the base and the emitter of transistor Q2b.

A series-combination of a ballasting capacitor CB and a gas discharge lamp GDL constitutes a load LD; which load is connected across output terminals Oa and Ob.

Description of Operation

The operation of the full-bridge inverter circuit of FIG. 1 may be explained as follows.

Source S provides 120 Volt/60 Hz voltage to the voltage-doubling and rectifying/filtering circuit consisting of R1, R2, C1 and C2. A substantially constant DC voltage of about 320 Volt magnitude then results at the output of this circuit, with the positive side of this DC voltage being present at the cathode of R1 and the negative side being present at the anode of R2.

This substantially constant-magnitude DC voltage is applied by way of inductor means IM and its two windings W1 and W2, poled as indicated, to the DC power input terminals B+ and B− of the full-bridge inverter circuit comprising transistors Q1a, Q1b, Q2a and Q2b.

This inverter circuit is made to self-oscillate by way of positive current feedback provided by saturable current-transformers SCT1 and SCT2, poled as indicated. Thus, the magnitude of the current provided to any given transistor's base-emitter junction is proportional to the magnitude of the current flowing between output terminals Oa and Ob.

The frequency of inverter oscillation is determined by a combination of the saturation characteristics of the saturable current-transformers and the natural resonance frequency of the parallel L-C circuit (as combined with any tuning effects caused by the load connected thereacross).

Figure 2:
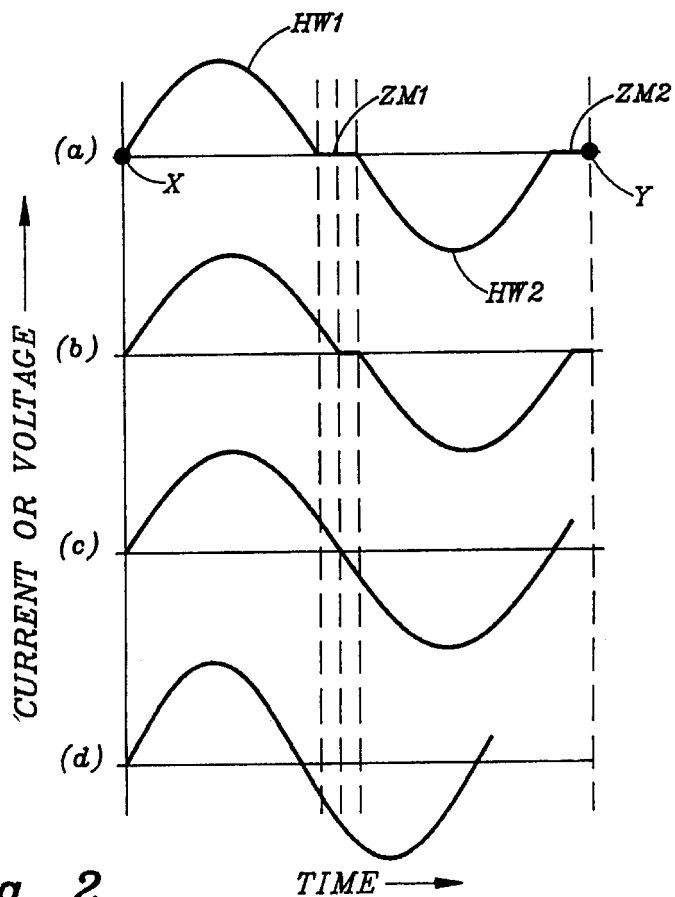
FIG. 2 shows various voltage waveforms associated with the preferred embodiment of the invention.

The saturation characteristics of the saturable current-transformers are substantially identical to one another and so chosen that, when there is no load connected across output terminals Oa and Ob, the waveform of the output voltage is as indicated in FIG. 2a; which waveform is made up of sinusoidal half-waves of voltage, indicated by HW1 and HW2, interconnected with periods of zero-magnitude voltage, indicated by ZM1 and ZM2. This waveform is achieved by making the time-length of the saturation-time required for the saturable current-transformers to reach saturation longer than the time-length of one of the sinusoidal half-waves of voltage. The degree to which the time-length of the saturation-time is longer than the time-length of one of the sinusoidal half-waves of voltage corresponds to the time-length of the periods of zero-magnitude voltage.

In FIG. 2a, each of the sinusoidal half-waves of voltage represents the natural interaction between L and C as fed from a substantially constant current source.

In combination, the two separate but equal windings W1 and W2 of inductor means IM provide for a total inductance that is large enough so that the current flowing through the two windings and into the inverter remains substantially constant during a complete time-period of one cycle of the inverter's oscillation. That is, the DC current flowing into the B+ junction and out of the B− junction is substantially constant during the interval between point X and point Y in FIG. 2a. Thus, whenever the L-C parallel circuit is connected between B+ and B− —which it is during the complete time-length of each of the sinusoidal half-waves of voltage—it is indeed fed from a substantially constant current source.

When a load impedance having a net component of capacitive reactance (such as does LD) is connected across the inverter's output terminals Oa and Ob, capacitive reactance is in effect added to the L-C parallel circuit; which results in the time-lengthening of the sinusoidal half-waves of voltage—as indicated by FIG. 2b. The more capacitance added this way, the more time-lengthening results.

On the other hand, when a load impedance having a net component of inductive reactance is connected between Oa and Ob, the result would be a time-shortening of the sinusoidal half-waves of voltage.

By having two different load impedances connected between Oa and Ob, and by having these two load impedances be of conjugate nature, there will be no net effect on the length of the period of the sinusoidal half-waves. For instance, by having another gas discharge lamp like GDL connected in series with an inductor having a reactance of the same absolute magnitude as that of CB, and by connecting this series-combination in parallel with load LD, the total net load impedance would be resistive and would cause no net shortening or lengthening of the sinusoidal half-waves of voltage.

By making the time-length of the saturation-time of the saturable current-transformers substantially equal to the time-length of one of the sinusoidal half-waves of voltage, the resulting output voltage will be as illustrated in FIG. 2c; which indicates that the net inversion frequency will now be the same as the natural resonance frequency of the L-C parallel circuit (as combined with whatever load impedance might be connected between Oa and Ob).

By making the time-length of the saturation-time of the saturable current-transformers shorter than the time-length of one of the sinusoidal half-waves of voltage, the resulting output voltage will be as illustrated in FIG. 2d; which indicates that the net inversion frequency will now be higher then the natural resonance frequency of the L-C circuit (as combined with whatever load impedance might be connected between Oa and Ob).

It is important to note that, as long as the time-length of the saturation-time of the saturable current-transformers remains equal to or longer than the time-length of one of the sinusoidal half-waves of voltage, the net inversion frequency will not be affected by the addition or removal of a load impedance, such as LD of FIG. 1, regardless of the magnitude of the net reactive impedance thereby added to or subtracted from the L-C parallel circuit.

The magnitude of the Zener voltage of Zener diode Z is chosen such as to be somewhat higher than the maximum magnitude of the peak voltage of the sinusoidal half-waves of voltage present across the inverter's output terminals Oa and Ob. That way, the Zener diode will not interfere with normal operation of the inverter; yet, it will prevent the magnitude of the peak voltages of the sinusoidal half-waves from substantially exceeding the normally occurring maximum magnitudes. Without the Zener diode, for various transient reasons (such as due to the sudden removal of a load) the magnitude of the peak voltages of the sinusoidal half-waves would occasionally become substantially larger than the normally occurring maximum magnitudes; and that would either cause transistor destruction, or it would necessitate the use of very special transistors of exceptionally high voltage capabilities.

It is noted that inductor L is center-tapped; which, in effect, provides for a center-tap between the inverter's output terminals Oa and Ob. This center-tap is grounded. In many applications, particularly in the case of fluorescent lamp ballasts, it is very valuable to have the output referenced to ground.

It is also noted that inductor L may be integrally combined with a center-tapped auto-transformer; in which case the output voltage can readily be provided at any desired magnitude, while maintaining a ground-connected center-tap.

It is yet also noted that inductor means IM may consist of two entirely independent inductors—with one inductor located in each leg of the power supply. In fact, it is even acceptable under some circumstances to use but a single inductor in just one leg of the power supply; in which case, however, it would not be possible to connect the output's center-tap with the power supply's center-tap.

It is not necessary to power the inverter of FIG. 1 from a voltage doubler. However, doing so provides for the advantage in many situations of being able to reference the center-tap of the inverter's output with one of the legs of the power line.

The inverter of FIG. 1 must be triggered into oscillation. This triggering may be accomplished by way of providing a special trigger winding on each of the feedback current-transformers, and then to discharge a capacitor through these trigger windings. This may be done automatically with an arrangement consisting of a capacitor-resistor combination connected between B+ and B−, and a Diac for discharging the capacitor through the trigger windings.

Finally, it is noted that the average absolute magnitude of the AC voltage appearing between inverter output terminals Oa and Ob must be substantially equal to the magnitude of the DC voltage provided from across the two series-connected energy-storing capacitors C1 and C2.

Or, stated differently, in the circuit of FIG. 1, if the inverter's AC output voltage as provided between terminals Oa and Ob were to be rectified in a full-wave rectifier, the average magnitude of the DC voltage obtained from this full-wave rectifier would have to be substantially equal to the magnitude of the DC voltage supplied from the DC output of the rectifier/filter combination consisting of R1, R2, C1 and C2.

This relationship would have to exist substantially regardless of the nature of the load connected between the inverter's output terminals.

Although the full-bridge inverter circuit of FIG. 1 may be designed to invert at any one of a wide range of frequencies, in the preferred embodiment the inversion frequency is approximately 30 kHz. Thus, the time-length of the interval between point X and point Y of FIG. 2a is about 33 micro-seconds.

It is believed that the present invention and its several attendant advantages and features will be understood from the preceeding description. However, without departing from the spirit of the invention, changes may be made in its form and in the construction and interrelationships of its component parts, the form herein presented merely representing the presently preferred embodiment.

What is claimed is:

1. An inverter powered from a constant-magnitude DC voltage by way of a first sub-assembly and providing, between a first and a second output terminal, an alternating output voltage having a periodic and substantially sinusoidal waveshape, said waveshape having a cyclical period, said first sub-assembly being operative to cause any current flowing from the DC voltage supply to the inverter to remain substantially constant during the time-length of said cyclical period, said inverter comprising:

a first and a second pair of series-connected switching transistors, each transistor having a control input terminal, said first pair of transistors each having a terminal that is connected with a first junction, said second pair of transistors each having a terminal that is connected with a second junction; the first and second junctions being galvanically connected with the first and second output terminals, respectively; and second sub-assembly connected between said junctions and in circuit with each transistor's control terminal, said second sub-assembly comprising a tuned circuit and a third sub-assembly functional to cause said transistors to switch on and off in a time-pattern operative to cause said output voltage to have said periodic and substantially sinusoidal waveshape.

2. The inverter of claim 1 wherein said tuned circuit is a parallel-tuned circuit.

3. The inverter circuit of claim 1 wherein said output sub-assembly has an output center-tap.

4. The inverter of claim 3 wherein said DC voltage supply has a set of supply terminals between which there exists an effective short circuit for currents of frequency about equal to that of the alternating output voltage, whereby any alternating voltage existing between any one of said supply terminals and said output center-tap has substantially zero magnitude.

5. The inverter of claim 4 wherein said DC voltage supply has a supply center-tap and where said output center-tap is connected with said supply center-tap.

6. The inverter of claim 1 wherein said first sub-assembly comprises a current-transformer device operative to provide intermittent drive current to the control terminal of each of said transistors, the presence of said drive current being operative to turn a transistor on, the magnitude of said drive current being substantially proportional to the magnitude of the current flowing between said junctions.

7. The inverter of claim 6 wherein said current-transformer device is characterized by being saturable.

8. The inverter of claim 1 and circuitry operative to cause said waveshape to comprise a short period of substantially zero voltage magnitude.

9. The inverter of claim 1 wherein said first sub-assembly comprises two separate windings on a common magnetic core.

10. Inverter circuit operable to be powered from a constant-magnitude DC voltage supply and to provide, between a first and a second output terminal, a periodic alternating output voltage having an overall periodic waveshape that may be characterized as consisting of periods with sinusoidally varying voltage interconnected with periods of substantially non-varying voltage, said periodic waveshape having a complete period, said inverter circuit comprising:

a pair of DC input terminals;

a first and a second pair of series-connected switching transistors, each pair being connected across said DC input terminals, each transistor having control input terminals, said first pair of transistors each having a terminal that is connected with a first junction, said second pair of transistors each having a terminal that is connected with a second junction; the first and second junctions being galvanically connected with the first and second output terminals, respectively;

a first sub-assembly connected in circuit between said DC voltage source and said pair of DC input terminals, said first sub-assembly being operative to prevent any current flowing between said DC voltage supply and said DC input terminals from changing by any substantial degree during the time-length of said complete period; and a second sub-assembly connected between said junctions and in circuit with said control input terminals, said second sub-assembly being characterized by comprising a tuned circuit as well as a third sub-assembly operative to cause said transistors to switch on and off in a time-pattern that, in turn, is operative to cause said output voltage to attain said overall periodic waveshape.

11. The inverter circuit of claim 10 wherein said periods of substantially non-varying voltage have a time-length of near-zero duration.

12. The inverter of claim 10 wherein said second sub-assembly has a center-tap connected with a terminal of said DC voltage supply.

13. The inverter of claim 10 wherein said third sub-assembly comprises two inductively coupled but separate windings, one of said windings being connected with one of said DC input terminals; the other one of said windings being connected with the other one of said DC input terminals.

14. An arrangement comprising:

DC voltage source operative to provide a constant-magnitude DC voltage between a first and a second DC terminal; the DC voltage source having a center-tap; the first DC terminal having a first DC potential with respect to the center-tap; the second DC terminal having a second DC potential with respect to the center-tap; the absolute magnitude of the first DC potential being approximately equal to that of the second DC potential;

an inverter having: (i) a B+ input terminal and a B− input terminal; and (ii) a first and a second transistor, each having a first and a second terminal; the first terminal of the first transistor being directly connected with the B− terminal; the second terminal of the first transistor being directly connected with the first terminal of the second transistor as well as with an inverter output terminal; the second terminal of the second transistor being directly connected with the B+ terminal; the two transistors being substantially identical to each other; and an inductor device having a first and a second winding; the first winding having a first and a second terminal; the second winding having a first and a second terminal; the first winding being coupled with the second winding such that the instantaneous magnitude of any voltage present between the first and second terminal of the first winding is substantially equal to that of any voltage present between the first and the second terminal of the second winding;

the first terminal of the first winding being connected with the first DC terminal; the second terminal of the first winding being connected with the B+ terminal; the second terminal of the second winding being connected with the second DC terminal; the first terminal of the second winding being connected with the B− terminal;

the arrangement being operative to provide an AC voltage between the inverter output terminal and the center-tap.

15. The arrangement of claim 14 wherein the AC voltage has a fundamental period that is substantially shorter than that of the power line voltage present on an ordinary electric utility power line.

16. The arrangement of claim 15 wherein a first current of a first instantaneous magnitude is flowing through the first winding and a second current of a second instantaneous magnitude is flowing through the second winding; the sum of the first instantaneous magnitude and the second instantaneous magnitude remaining substantially constant over the duration of said fundamental period.

17. The arrangement of claim 14 wherein the inverter also has a third and a fourth transistor as well as another inverter output terminal; another AC voltage being provided between the other inverter output terminal and the center-tap.

18. The arrangement of claim 14 wherein the AC voltage has a substantially sinusoidal waveform.

19. The arrangement of claim 14 wherein any alternating voltage existing between the first DC terminal and the second DC terminal, as well as between the first DC terminal and the center-tap, is of negligible magnitude.

20. The arrangement of claim 19 wherein the AC voltage has a substantially sinusoidal waveform.

21. An arrangement comprising:

DC voltage source operative to provide a constant-magnitude DC voltage between a first and a second DC terminal; any alternating voltage existing between the first and second DC terminals being of negligible magnitude;

inverter circuit having: (i) a B+ input terminal and a B− input terminal; and (ii) a first and a second transistor, each having a first and a second terminal; the first terminal of the first transistor being directly connected with the B-terminal; the second terminal of the first transistor both being connected with an inverter output terminal; the second terminal of the second transistor being directly connected with the B+ terminal; the first transistor being substantially identical to the second transistor; and an inductor having a first and a second winding; the first winding having a first and a second terminal; the second winding having a first and a second terminal; the first winding being coupled with the second winding such that the instantaneous magnitude of any voltage present between the first and second terminal of the first winding is substantially equal to that of any voltage present between the first and the second terminal of the second winding; the first terminal of the first winding being galvanically connected with the first DC terminal; the second terminal of the first winding being galvanically connected with the B+ terminal; the second terminal of the second winding being galvanically connected with the second DC terminal; the first terminal of the second winding being galvanically connected with the B− terminal;

the arrangement being operative to provide an AC voltage between the inverter output terminal and the center-tap.

22. The arrangement of claim 21 further characterized in that any alternating voltage existing between the center-tap and either one of the DC terminals is of negligible magnitude.

23. The arrangement of claim 22 wherein the AC voltage is further characterized as being of substantially sinusoidal waveform.

24. The arrangement of claim 21 wherein the DC voltage source is connected with a source of ordinary AC power line voltage by way of a rectifier assembly.

25. An arrangement comprising:

a first and a second DC terminal between which is provided a constant-magnitude DC voltage; and an inverter connected with the DC terminals by way of a first sub-assembly and operative to provide, between a first and a second output terminal, an alternating output voltage having a periodic and substantially sinusoidal waveshape; the waveshape having a cyclical period; the first sub-assembly being operative to cause any current flowing from the DC terminals to the inverter to remain substantially constant during the duration of the cyclical period; the inverter being further characterized by including:

a first and a second pair of series-connected switching transistors; each transistor having a control input terminal; the first pair of transistors each having a terminal that is galvanically connected with a first junction; the second pair of transistors each having a terminal that is galvanically connected with a second junction; the first and second junctions being galvanically connected with the first and second output terminals, respectively; and a second sub-assembly connected between the junctions as well as in circuit with each transistor's control terminal; the second sub-assembly including a tuned circuit as well as a third sub-assembly functional to cause the transistors to switch on and off in a time-pattern operative to cause the output voltage to have said periodic and substantially sinusoidal waveshape.

26. The arrangement of claim 24 wherein the first and second output terminals are galvanically connected to each other.

* * * * *